United States Patent
Arai (10) Patent No.: US 11,970,643 B2
(45) Date of Patent: Apr. 30, 2024

(54) SUCTION FIXING SHEET

(71) Applicant: NITTO DENKO CORPORATION, Osaka (JP)

(72) Inventor: Masahiro Arai, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 91 days.

(21) Appl. No.: 17/274,288

(22) PCT Filed: Sep. 6, 2019

(86) PCT No.: PCT/JP2019/035273
§ 371 (c)(1),
(2) Date: Mar. 8, 2021

(87) PCT Pub. No.: WO2020/054635
PCT Pub. Date: Mar. 19, 2020

(65) Prior Publication Data
US 2021/0348033 A1 Nov. 11, 2021

(30) Foreign Application Priority Data
Sep. 12, 2018 (JP) .................................. 2018-170960

(51) Int. Cl.
*B25B 11/00* (2006.01)
*C09J 7/26* (2018.01)

(52) U.S. Cl.
CPC .............. *C09J 7/26* (2018.01); *B25B 11/005* (2013.01); *C09J 2301/124* (2020.08); *C09J 2301/16* (2020.08); *C09J 2301/204* (2020.08)

(58) Field of Classification Search
None
See application file for complete search history.

(56) References Cited

U.S. PATENT DOCUMENTS

2005/0074606 A1 4/2005 Nishiyama et al.
2011/0183108 A1 7/2011 Tachibana

FOREIGN PATENT DOCUMENTS

JP 09-22935 1/1997
JP 2003-277702 10/2003
(Continued)

OTHER PUBLICATIONS

Official Communication issued in International Bureau of Wipo Patent Application No. PCT/JP2019/035273, dated Dec. 3, 2019.
(Continued)

*Primary Examiner* — Scott R. Walshon
*Assistant Examiner* — Thomas A Mangohig
(74) *Attorney, Agent, or Firm* — Greenblum & Bernstein, P.L.C.

(57) ABSTRACT

The present disclosure provides a suction fixing sheet to be placed on a suction surface of a suction device to prevent contact between a suction target and the suction surface, the suction fixing sheet including: a porous sheet having air permeability in its thickness direction; and an adhesive layer having air permeability in its thickness direction and disposed on one surface of the porous sheet; wherein the adhesive layer includes a crosslinked adhesive agent, and sucked force obtained for the suction fixing sheet when the sheet area is 100 cm$^2$, the sucked force being measured by a predetermined method, is 450 N or more. The suction fixing sheet of the present invention can suppress a decrease in processing accuracy of a suction target even when the sheet is used under high temperature conditions.

16 Claims, 5 Drawing Sheets

(56) References Cited

FOREIGN PATENT DOCUMENTS

| | | |
|---|---|---|
| JP | 2003-313516 | 11/2003 |
| JP | 2005-105212 | 4/2005 |
| JP | 2007-308666 | 11/2007 |
| JP | 2008-251653 | 10/2008 |
| JP | 2009-023777 | 2/2009 |
| WO | 2016/111208 | 7/2016 |

OTHER PUBLICATIONS

Extended European Search Report issued on the corresponding European Patent Application No. 19860111.4 , dated May 20, 2022.
Japan Official Action received in JP Application No. 2018-170960, dated Jan. 17, 2023.
Japan Office Action received in Japanese Patent Application No. 2018-170960, dated Jun. 13, 2023.

SUCTION FIXING SHEET

TECHNICAL FIELD

The present invention relates to a suction fixing sheet to be placed on a suction surface of a suction device to prevent contact between a suction target and the suction surface.

BACKGROUND ART

Steps of processing a thin and light sheet-like body such as a metal foil, a plastic film, or a ceramic green sheet for use in production of ceramic capacitors conventionally involve fixing or conveying the sheet-like body while holding the sheet-like body on a suction surface of a suction device by suction. At this time, it has been common practice to place an air-permeable suction fixing sheet on the suction surface. The suction fixing sheet placed on the suction surface prevents direct contact between the sheet-like body, which is a suction target, and the suction surface. This can prevent damage to the suction target, formation of scratches on the suction surface, contamination of the suction surface with components contained in the suction target, and the like during the suction holding of the suction target. The scratches on the suction surface and the contamination of the suction surface can cause defects in suction targets to be subsequently suction-held on the suction surface.

Patent Literature 1 discloses a suction fixing sheet that includes a porous sheet made of ultrahigh molecular weight polyethylene and a hot-melt adhesive agent disposed on one side of the porous sheet. The suction fixing sheet of Patent Literature 1 is used in a state of being fixed to a suction surface of a suction device with the hot-melt adhesive agent.

CITATION LIST

Patent Literature

Patent Literature 1: JP H09(1997)-22935 A

SUMMARY OF INVENTION

Technical Problem

During a suction pressing process in which a suction target is subject to pressing in a state of being suction-held, a suction fixing sheet may be exposed to a high processing temperature. The processing temperature is expected to be increased, for example, to improve processing efficiency. Studies by the present inventors have revealed that in the case of using the suction fixing sheet of Patent Literature 1 in which the hot-melt adhesive agent is disposed, the processing accuracy of a suction target tends to decrease with an increase in the processing temperature.

The present invention aims to provide a suction fixing sheet that can suppress a decrease in processing accuracy of a suction target even when the sheet is used under high temperature conditions.

Solution to Problem

The present invention provides a suction fixing sheet to be placed on a suction surface of a suction device to prevent contact between a suction target and the suction surface, the suction fixing sheet including:
 a porous sheet having air permeability in its thickness direction; and
 an adhesive layer having air permeability in its thickness direction and disposed on one surface of the porous sheet; wherein
 the adhesive layer includes a crosslinked adhesive agent, and
 sucked force obtained for the suction fixing sheet when the sheet area is 100 cm$^2$ is 450 N or more, the sucked force being a value determined as per the following equation: ultimate vacuum pressure (kPa)×sheet area 100 cm$^2$, the ultimate vacuum pressure (kPa) being caused to occur in a predetermined suction fixing stage when suction force is generated in the suction fixing stage in the state where the suction fixing sheet is fixed to the suction fixing stage with the adhesive layer interposed therebetween and a non-air permeable measurement sheet is stacked on a surface on the porous sheet side of the suction fixing sheet.

Advantageous Effects of Invention

The studies by the present inventors have revealed that in the suction fixing sheet of Patent Literature 1 in which the hot-melt adhesive agent is disposed, the hot-melt adhesive agent is caused to flow under high temperature conditions and therefore wrinkling and lifting of the suction fixing sheet on the suction surface occurs, which tends to decrease the processing accuracy of a suction target. On the other hand, in the suction fixing sheet of the present invention, the adhesive agent included in an adhesive layer is crosslinked. Thus, occurrence of wrinkling and lifting of the suction fixing sheet on a suction surface attributable to a flow of the adhesive layer is suppressed under high temperature conditions.

Additionally, the present inventors considered the use of adhesive agents other than the hot-melt adhesive agent disclosed in Patent Literature 1, but there still remained the decrease in processing accuracy of a suction target. Further studies of this phenomenon have revealed the followings: (I) unlike the case of the hot-melt adhesive agent capable of being applied in a molten state by spraying, the conformability of an adhesive agent other than the hot-melt adhesive agent to asperities on a porous sheet surface cannot be sufficiently ensured and a gap tends to be formed between the porous sheet and the adhesive agent disposed on the sheet; (II) the gap causes an increase in air permeation through the suction fixing sheet in its in-plane direction during suction holding; and (III) the above air permeation in the in-plane direction causes a decrease in sucked force of the suction fixing sheet to a suction surface and makes displacement of the suction fixing sheet on the suction surface likely, whereby the processing accuracy of a suction target is decreased. In the case of the suction fixing sheet of the present invention, the adhesive agent included in the adhesive layer is a crosslinked adhesive agent and the sucked force per given area is equal to or more than the given value, and thus occurrence of displacement of the suction fixing sheet on a suction surface is suppressed.

Therefore, the present invention can provide a suction fixing sheet that can suppress a decrease in processing accuracy of a suction target even when the sheet is used under high temperature conditions.

DESCRIPTION OF EMBODIMENTS

Hereinafter, embodiments of the present invention will be described with reference to the drawings. The present invention is not limited to the embodiments to be described below.

[Suction Fixing Sheet]

Figure 1:
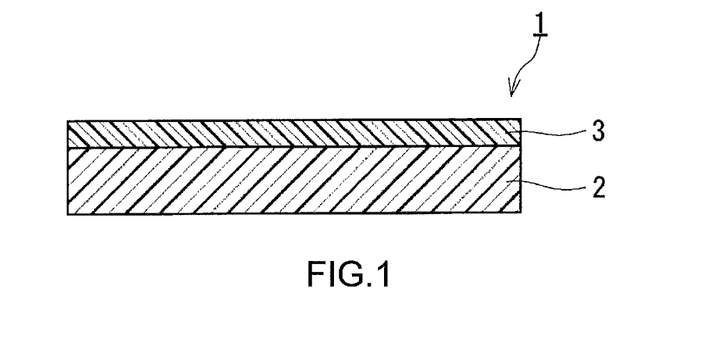
FIG. 1 is a cross-sectional view schematically showing an example of a suction fixing sheet of the present invention.

FIG. 1 shows an example of the suction fixing sheet of the present invention. A suction fixing sheet 1 shown in FIG. 1 includes a porous sheet 2 having air permeability in its thickness direction and an adhesive layer 3 having air permeability in its thickness direction. The adhesive layer 3 is disposed on one surface of the porous sheet 2. The suction fixing sheet 1 has air permeability in its thickness direction. The suction fixing sheet 1 can be used as a suction fixing sheet to be placed on a suction surface of a suction device to prevent contact between a suction target and the suction surface. The suction fixing sheet 1 is placed and fixed on a suction surface of a suction device in such a manner that the adhesive layer 3 is in contact with the suction surface. In the present specification, the term "thickness direction" of a sheet or a layer means any direction in which one surface and the other surface of the sheet or the layer are connected. For example, although through holes 12 serving as air flow paths in the thickness direction of a double-sided adhesive sheet 11 which is the adhesive layer 3 extend in a direction perpendicular to surfaces 11a and 11b of the sheet 11 in the example shown in FIG. 3, the direction in which the through holes 12 extend is not limited to this perpendicular direction. As long as the through holes 12 connect the one surface 11a and the other surface 11b of the double-sided adhesive sheet 11, the direction in which the through holes 12 extend may be inclined with respect to the perpendicular direction.

Sucked force obtained for the suction fixing sheet 1 when the sheet area is 100 cm$^2$ is 450 N or more ("sucked force obtained when the sheet area is 100 cm$^2$" is hereinafter simply referred to as "sucked force"). The sucked force of the suction fixing sheet 1 may be 475 N or more, 500 N or more, 525 N or more, 550 N or more, or even 575 N or more. The upper limit of the sucked force of the suction fixing sheet 1 is, for example, 10,000 N or less. The sucked force of the suction fixing sheet 1 is a value obtained at ordinary temperature.

The sucked force of the suction fixing sheet 1 is a value determined by the following method. The method of measuring the sucked force of the suction fixing sheet 1 is described with reference to FIG. 2.

Figure 2:
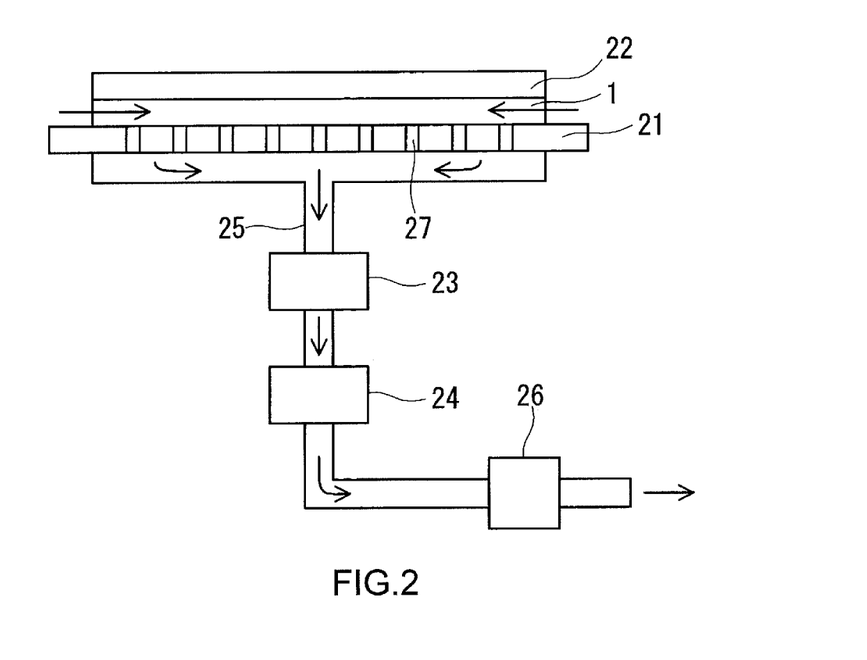
FIG. 2 is a schematic view for illustrating a method of measuring sucked force of a suction fixing sheet.

First, the suction fixing sheet 1 is fixed to a predetermined suction fixing stage 21 with the adhesive layer 3 interposed therebetween, and a non-air permeable measurement sheet 22 is stacked on a surface on the porous sheet 2 side of the suction fixing sheet 1. The suction fixing sheet 1 has an area of 100 cm$^2$. The suction fixing sheet 1 preferably has a shape of a 10 cm×10 cm square.

The suction fixing stage 21 is a flat stage made of a metal such as stainless steel and is connected to a vacuum pump 26 by a pipe 25 provided with a pressure meter 23 and a flowmeter 24. A plurality of through holes 27 (diameter: 1 mm) having circular openings and circular cross-sections is provided at a center-to-center distance (pitch) of 3 mm in a region A of the suction fixing stage 21, the region A to which the suction fixing sheet 1 is to be fixed. The through holes 27 are provided such that, when viewed in a direction perpendicular to a fixing surface of the suction fixing stage 21, the centers of the openings of the through holes 27 are at intersections (lattice points) of a virtual square lattice on the fixing surface. Activation of the vacuum pump 26 generates a flow of air passing through the through holes 27 in a direction from the fixing surface of the suction fixing stage 21 to the pipe 25, thereby generating suction force in the suction fixing stage 21. The through holes 27 may be provided in a region other than the region A of the suction fixing stage 21. In that case, the vacuum pump 26 generates a negative pressure only in the through holes 27 in the region A when the later-described ultimate vacuum pressure is measured. In the region A of the suction fixing stage 21, a surface (fixing surface) portion not having the through holes preferably has a surface roughness of 2.0 μm or less as expressed in terms of arithmetic average surface roughness Ra prescribed in Japanese Industrial Standards (hereinafter referred to as "JIS") B 0601: 2001. The suction fixing sheet 1 is fixed to the suction fixing stage 21 by disposing the suction fixing sheet 1 on the suction fixing stage 21 in such a manner that the sheet 1 is not folded or does not overlap itself and then moving a roller having a mass of 2 kg back and forth once over the surface of the suction fixing sheet 1. As the roller can be used, for example, one conforming to JIS Z 0237: 2009 "Testing methods of pressure-sensitive adhesive tapes and sheets".

The measurement sheet 22 stacked on the suction fixing sheet 1 is a non-air permeable sheet. The measurement sheet 22 is stacked on the sheet 1 to eliminate the air permeability of the suction fixing sheet 1 in the thickness direction when the sucked force is measured. For example, a metal sheet and a resin sheet can be used as the measurement sheet 22. A typical example of the measurement sheet 22 is a 25-μm-thick polyethylene terephthalate (PET) sheet. The term "non-air permeable sheet" as used in the present specification refers to a sheet whose air permeability in the thickness direction is 10,000 sec/100 mL or more as expressed in terms of air permeance (Gurley permeability) measured according to Method B for air permeability measurement (Gurley method) as prescribed in JIS L 1096: 2010. The area of the measurement sheet 22 is equal to or larger than the area of the suction fixing sheet 1. The measurement sheet 22 is stacked on the suction fixing sheet 1 in such a manner that the sheet 22 is not folded or does not overlap itself and the sheet 22 covers the suction fixing sheet 1 entirely.

Next, the vacuum pump 26 is activated to generate suction force in the suction fixing stage 21. The laminate of the measurement sheet 22 and the suction fixing sheet 1 fixed to the fixing surface of the suction fixing stage 21 hampers the flow of air passing through the through holes 27, and thus a vacuum pressure (negative pressure) is generated in the suction fixing stage 21. The intensity of the vacuum pressure obtained when the generated suction force is stabilized varies depending on the flow rate of air passing through the suction fixing sheet 1 in the in-plane direction. More specifically, the smaller the flow rate of the air is, the greater such a vacuum pressure is. The sucked force of the suction fixing sheet 1 can be determined by the following equation: ultimate vacuum pressure (kPa)×sheet area 100 cm$^2$, the ultimate vacuum pressure (kPa) being the maximum vacuum pressure caused to occur in the suction fixing stage 21 by the generation of the suction force, the ultimate vacuum pressure (kPa) being measured with the pressure meter 23. It is to be noted that the flow rate of air flowing in the pipe 25 when the generated suction force is stabilized corresponds to the flow rate of air passing through the suction fixing sheet 1 in the in-plane direction. Therefore, the flow rate measured with the flowmeter 24 can be employed as the air permeability of the suction fixing sheet 1 in the in-plane direction. The air permeability of the suction fixing sheet 1 in the in-plane direction changes depending on the configurations of the porous sheet 2 and the adhesive layer 3. To measure the sucked force with accuracy, an oil-sealed rotary vacuum pump, a diaphragm dry vacuum pump, a rocking piston dry vacuum pump, and a vane pump, which are excellent in ultimate pressure and effective exhaust velocity, are preferably used as the vacuum pump 26. The ultimate pressure of the vacuum pump 26 is, for example, 86 Pa as expressed in terms of absolute pressure, and the effective exhaust velocity of the vacuum pump 26 is, for example, 235 L/min.

In the suction fixing sheet 1 in FIG. 1, the adhesive layer 3 is disposed over one entire surface of the porous sheet 2. More specifically, in the suction fixing sheet 1 in FIG. 1, the adhesive layer 3 having the same shape as the porous sheet 2 is disposed on the one surface of the porous sheet 2 in such a manner that the adhesive layer 3 and the porous sheet 2 fully overlap each other when viewed in a direction perpendicular to the one surface of the porous sheet 2. In the suction fixing sheet 1 of the present invention, the adhesive layer 3 need not be disposed over the one entire surface of the porous sheet 2. However, in order to obtain the above-described effects more reliably, the adhesive layer 3 preferably is disposed on the one entire surface of the porous sheet 2 at least in a region to be in contact with a suction target during suction holding of the suction target by a suction device.

The porous sheet 2 is, for example, a woven fabric, a nonwoven fabric, a film (metal film, resin film, or the like) that is perforated in its thickness direction, or a sintered sheet of resin particles, and is preferably a sintered sheet of resin particles. When the porous sheet 2 is a sintered sheet, it is possible to avoid adhesion of foreign substances resulting from shedding of fibers to a suction target, and also to avoid deformation of the suction target and surface damage to the suction target caused by the foreign substances. In addition, void spaces between the particles are present all over the porous sheet 2, and they can serve as air flow paths in the porous sheet 2. This enables more uniform suction holding of a suction target. It is to be noted, however, that the porous sheet 2 is not limited to the above examples as long as the porous sheet 2 has air permeability in its thickness direction.

The resin as a component of the resin particles is preferably ultrahigh molecular weight polyethylene (hereinafter referred to as "UHMWPE") in terms of excellent wear resistance and impact resistance of the porous sheet 2 formed thereof. That is, the porous sheet 2 is preferably a sintered sheet of UHMWPE particles. It is to be noted, however, that the resin as a component of the resin particles is not limited as long as the porous sheet 2 can be formed by sintering. The weight-average molecular weight Mw of UHMWPE is, for example, 500,000 or more and preferably 1,000,000 or more. The weight-average molecular weight of UHMWPE can be evaluated by high-temperature gel permeation chromatography (high-temperature GPC).

The sintered sheet of UHMWPE particles can be produced by known methods, for example, methods 1 to 3 to be described below. The method 1 is a method in which UHMWPE particles charged in a mold are sintered to form a sintered block of the UHMWPE and the thus-formed sintered block is processed into a sheet by cutting. The sintered block may have a cylindrical shape. The method 2 is a method in which UHMWPE particles charged in a sheet shape are sintered. The method 3 is a method in which a slurry containing UHMWPE particles dispersed in a dispersion medium is applied to a transfer sheet, which is typically a metal sheet, to form a coating having a predetermined thickness and the coating is then heated to a temperature equal to or higher than the melting point of the UHMWPE to obtain a sheet-shaped sintered body. The surface of the transfer sheet, the surface to which the slurry is applied, may have been subjected to a release treatment. In any of these methods, UHMWPE particles having an average particle diameter of, for example, 20 to 500 μm can be used.

The thickness of the porous sheet 2 is, for example, 0.050 mm to 3.0 mm, and may be 0.1 mm to 2.0 mm or even 0.2 mm to 1.5 mm. When the thickness of the porous sheet 2 falls within these ranges, the above-described effects can be obtained more reliably.

The air permeability of the porous sheet 2 in the thickness direction is, for example, 0.5 cm$^3$/(cm$^2$·sec) to 20 cm$^3$/(cm$^2$·sec) as expressed in terms of Frazier number measured according to Method A for air permeability measurement (Frazier method) prescribed in JIS L 1096: 2010 (hereinafter the Frazier number measured by this method is simply referred to as "Frazier number"). The lower limit of the air permeability as expressed in terms of Frazier number may be 1.0 cm$^3$/(cm$^2$·sec) or more, 2.0 cm$^3$/(cm$^2$·sec) or more, more than 2.0 cm$^3$/(cm$^2$·sec), 2.5 cm$^3$/(cm$^2$·sec) or more, or even 3.0 cm$^3$/(cm$^2$·sec) or more. The upper limit of the air permeability as expressed in terms of Frazier number is, for example, 10 cm$^3$/(cm$^2$·sec) or less, and may be 8.0 cm$^3$/(cm$^2$·sec) or less. The porous sheet 2 preferably has high air permeability in the thickness direction from the viewpoint of allowing the time (takt time) required for suction-holding a suction target to be reduced. However, the porous sheet 2 with high air permeability generally has a high porosity, which may deteriorate the properties required for the suction fixing sheet 1, such as strength, wear resistance, and impact resistance. When the air permeability of the porous sheet 2 in the thickness direction falls within the above-described ranges, the balance between the takt time and the above-described properties becomes more favorable especially in the case where the porous sheet 2 is a sintered sheet of resin particles.

The porosity of the porous sheet 2 is, for example, 15% to 50%, and may be 20% to 45%. When the porosity of the porous sheet 2 falls within these ranges, the balance between the takt time and the above-described properties becomes still more favorable especially in the case where the porous sheet 2 is a sintered sheet of resin particles. The porosity of the porous sheet 2 can be determined from the volume V (cm$^3$), the true specific gravity D (g/cm$^3$), and the mass M (g) of the porous sheet as per the following equation: Porosity (%)={1−M/(V×D)}×100.

The surface roughness of the porous sheet 2, in particular, the surface roughness of the surface to be in contact with a suction target during suction holding is preferably 1.0 μm or less and more preferably 0.5 μm or less as expressed in terms of arithmetic average surface roughness Ra prescribed in JIS B 0601: 2001. When Ra of the porous sheet 2 falls within these ranges, unintended deformation of the suction target or surface damage to the suction target caused by the contact with the porous sheet 2 during suction holding can be suppressed. When the porous sheet 2 is a sintered sheet of resin particles, Ra of the porous sheet 2 can relatively easily fall within the above-described ranges. The surface roughness of the sheet can be controlled by, for example, adjusting the particle diameter of the resin particles.

The porous sheet 2 may have a single-layer structure, or may have a laminate structure composed of two or more layers having different properties and/or structures.

The thickness of the adhesive layer 3 is, for example, 1 to 300 μm, and may be 10 to 200 μm or even 20 to 100 μm.

The adhesive layer 3 is, for example, (1) a double-sided adhesive sheet having a substrate and provided with a plurality of through holes or (2) a layer formed of a plurality of pieces of the above crosslinked adhesive agent disposed spaced apart from each other on one surface of the porous sheet 2. It is to be noted, however, that the adhesive layer 3 is not limited to the examples (1) and (2) as long as the adhesive layer 3 has air permeability in the thickness direction.

Figure 3:
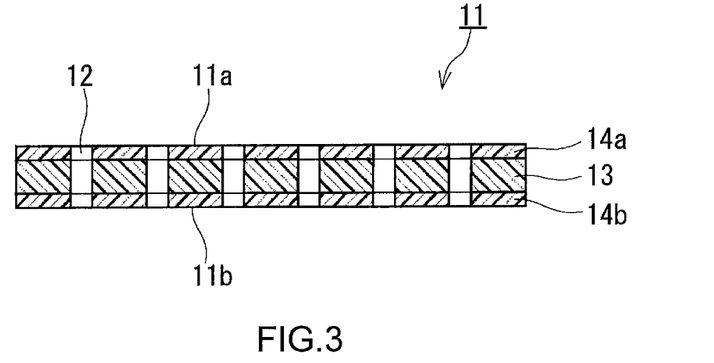
FIG. 3 is a cross-sectional view schematically showing an example of a double-sided adhesive sheet that may be included as an adhesive layer in the suction fixing sheet of the present invention.

FIG. 3 shows an example of the adhesive layer 3 that is the double-sided adhesive sheet of (1). The double-sided adhesive sheet 11 shown in FIG. 3 includes a substrate 13, an adhesive agent layer 14a formed on one surface of the substrate 13, and an adhesive agent layer 14b formed on the other surface of the substrate 13. The through holes 12 connects one surface 11a and the other surface 11b of the double-sided adhesive sheet 11. In other words, the through holes 12 pass through the substrate 13 and the adhesive agent layers 14a and 14b. The through holes 12 function as air flow paths in the thickness direction in the double-sided adhesive sheet 11. The double-sided adhesive sheet 11 has air permeability in the thickness direction owing to the through holes 12. Additionally, when viewed in a direction perpendicular to the surfaces 11a and 11b of the double-sided adhesive sheet 11, the sheet 11 has a structure in which the substrate 13 surrounds the through holes 12 serving as air flow paths in the thickness direction. Therefore, in the double-sided adhesive sheet 11 and the suction fixing sheet 1 including the sheet 11, air permeation in the in-plane direction can be suppressed more reliably while air permeation in the thickness direction is ensured, and that can increase the sucked force of the suction fixing sheet 1. The adhesive layer 3 that is a double-sided adhesive sheet is not limited to the example shown in FIG. 3.

The substrate 13 may be a film that does not have any air flow paths connecting one surface and the other surface except for the through holes 12. More specifically, the substrate 13 may be a film obtained by forming the through holes 12 in a non-porous film.

The material of the substrate 13 is a resin, for example. Examples of the resin include: polyolefins such as polyethylene and polypropylene; polyesters such as polyethylene terephthalate (PET); polycarbonate (PC); acrylic resins; and butyl rubber. The resin is preferably PET or PC, and more preferably PET. PET and PC are relatively hard resin materials, and, for example, even when the area of the suction fixing sheet 1 is large, the suction fixing sheet 1 is unlikely to be loosened or wrinkled at the time of fixing the sheet 1 on a suction surface. Further, PET and PC can maintain sufficient strength even under possible high temperature conditions. The material of the substrate 13 is not limited to the above examples.

The substrate 13 may be a film obtained by forming the through holes 12 in a non-porous resin film, and may be a film obtained by forming the through holes 12 in a non-porous PET film.

The thickness of the substrate 13 is, for example, 0.005 mm to 0.2 mm, and may be 0.01 mm to 0.1 mm. When the thickness of the substrate 13 falls within these ranges, the above-described effects can be obtained more reliably.

The adhesive agent (adhesive composition) contained in the adhesive agent layers 14a and 14b is a crosslinked adhesive agent.

Examples of the crosslinked adhesive agent include various types of acrylic, urethane, silicone, and epoxy adhesive agents. Viewed from another aspect, the crosslinked adhesive agent is, for example, a crosslinkable adhesive agent or an ultraviolet-curable adhesive agent. The crosslinkable adhesive agent is an adhesive agent containing a crosslinking agent. Acrylic, urethane, and silicone adhesive agents are commonly classified as crosslinkable adhesive agents. Among the adhesive agents given above as examples, acrylic and/or silicone adhesive agents are preferable because of their particularly low flowability at high temperatures. It is to be noted, however, that the crosslinked adhesive agent is not limited to the above examples. Moreover, a known crosslinked adhesive agent may be used as the crosslinked adhesive agent. Whether an adhesive agent is a crosslinked adhesive agent can be determined by dissolving the adhesive agent in a solvent (e.g., toluene at 25° C.) that dissolves adhesive agents and checking whether there is a component left undissolved (gel content). Hot-melt adhesive agents commonly leave no gel content and thus do not fall under the category of crosslinked adhesive agents.

An acrylic adhesive agent is an adhesive agent containing an acrylic polymer as a base polymer. The acrylic adhesive agent may be a known acrylic adhesive agent. Examples of the acrylic adhesive agent include those disclosed in JP 2005-105212 A.

A silicone adhesive agent is an adhesive containing a silicone polymer as a base polymer. The silicone adhesive agent may be a known silicone adhesive agent. Examples of the silicone adhesive agent include those disclosed in JP 2003-313516 (including those disclosed in the comparative examples).

The adhesive agent layer 14a formed on one surface of the substrate 13 and the adhesive agent layer 14b formed on the other surface of the substrate 13 may have the same structure or may have structures different from each other. In one example of the double-sided adhesive sheet 11, the adhesive agent layers 14a and 14b are both formed of an acrylic adhesive agent. In another example of the double-sided adhesive sheet 11, the one adhesive agent layer 14a is formed of a silicone adhesive agent and the other adhesive agent layer 14b is formed of an acrylic adhesive agent.

A suction surface of a suction device is commonly made of a metal such as stainless steel. Comparing an adhesive agent layer formed of an acrylic adhesive agent and an adhesive agent layer formed of a silicone adhesive agent, the adhesive agent layer formed of a silicone adhesive agent can reduce the amount of adhesive agent residue (the residual amount of the adhesive agent forming the adhesive agent layer) on the suction surface. The suction fixing sheet 1 fixed to the suction surface is usually replaced after a suction holding step has been performed a predetermined number of times or when the wear amount of the surface of the porous sheet 2 to be in contact with a suction target has reached a predetermined value. At the time of replacement, if there is an adhesive agent residue on the suction surface, the surface of a newly disposed suction fixing sheet 1 may become uneven owing to the presence of the adhesive agent remaining on the suction surface, and this may cause unintended deformation of a suction target to be subsequently suction-held, surface damage to such a suction target, or a decrease in processing accuracy of a suction target. On this account, the amount of adhesive agent residue is desirably as small as possible at the time of replacing the suction fixing sheet 1. Also, when the porous sheet 2 is a nonwoven fabric or a sintered sheet of resin particles, acrylic adhesive agents exhibit higher adhesive strength to the porous sheet 2 than silicone adhesive agents. Taking them into account, the suction fixing sheet 1 may be configured such that the one adhesive agent layer 14a is formed of a silicone adhesive agent, the other adhesive agent layer 14b is formed of an acrylic adhesive agent, and the adhesive agent layer 14b is in contact with the porous sheet 2, and the sheet 1 may be fixed to a suction device in such a manner that the adhesive agent layer 14a is in contact with the suction surface. This configuration can reduce the amount of adhesive agent residue on the suction surface at the time of replacing the suction fixing sheet 1 and can more reliably suppress a decrease in processing accuracy of a suction target.

The gel fraction of the crosslinked adhesive agent is, for example, 1% to 90%, and may be 2% to 80% or 5% to 60%. When the gel fraction falls within these ranges, the crosslinked adhesive agent can exhibit still lower flowability at high temperatures. The gel fraction of the adhesive agent can be evaluated as follows, for example.

[Gel Fraction of Acrylic Adhesive Agent]

About 0.1 g of an adhesive agent layer to be evaluated is collected. The collected adhesive agent layer is wrapped with a polytetrafluoroethylene (PTFE) porous film having an average pore diameter of 0.2 μm (e.g., NTF 1122 manufactured by Nitto Denko Corporation). Thereafter, they were bound together with a kite string to prepare an evaluation sample. The weight of the evaluation sample (the weight c before immersion) is measured. The weight before immersion corresponds to the total weight of the collected adhesive agent, the PTFE porous film, and the kite string. Also, the sum of the weights of the PTFE porous film and the kite string used to prepare the evaluation sample is measured beforehand, and this is defined as the wrapper weight b.

The evaluation sample is then placed in a 50 mL container filled with ethyl acetate and allowed to stand still at 23° C. for 7 days. Thereafter, the evaluation sample is taken out from the container, placed in an aluminum cup, and dried in a dryer set at 130° C. for 2 hours to remove the ethyl acetate. Next, the weight of the evaluation sample is measured, and this weight is defined as the weight a after immersion.

The gel fraction can be determined from the thus-measured weight a after immersion, wrapper weight b, and weight c before immersion as per the following equation.

Equation: Gel fraction (wt %)=$(a-b)/(c-b)\times 100$

[Gel Fraction of Silicone Adhesive Agent]

An evaluation sample having dimensions of about 19 mm×about 250 mm is prepared by forming a silicone adhesive agent layer to be evaluated on a surface of a substrate sheet. As the substrate sheet, a sheet made of a material that does not swell in toluene is selected. The substrate sheet is a PTFE sheet, for example. Then, the weight (weight C before immersion) of the evaluation sample is measured.

Next, the evaluation sample is immersed in about 300 mL of toluene at ordinary temperature for 48 hours. Thereafter, the evaluation sample is taken out from the toluene and air-dried for 30 minutes. Then, the evaluation sample is dried in a dryer set at 120° C. for 2 hours to remove the toluene. Subsequently, the evaluation sample is placed at room temperature and left to stand for 30 minutes. Thereafter, the weight A of the evaluation sample after immersion is measured. Then, the adhesive agent layer is removed from the substrate sheet, and the weight B of the substrate sheet is measured.

The gel fraction can be determined from the thus-measured weight A after immersion, weight B of the substrate sheet, and weight C before immersion as per the following equation.

Equation: Gel fraction (wt %)=$(A-B)/(C-B)\times 100$

The thickness of each of the adhesive agent layers 14a and 14b is, for example, 0.005 mm to 0.3 mm, and may be 0.01 mm to 0.2 mm.

In the example shown in FIG. 3, the direction in which the through holes 12 extend is the direction perpendicular to the surfaces of the double-sided adhesive sheet 11. In this example, the through holes 12 extend linearly. Furthermore, in this example, the shape of the cross section of each through hole 12 (the cross section perpendicular to the direction in which the through hole 12 extends) is uniform from one surface to the other surface of the double-sided adhesive sheet 11. It is to be noted that the structure of the through holes 12, including the direction in which they extend, the state in which they extend, and the shape of their cross sections, is not limited as long as the double-sided adhesive sheet 11 has air permeability in its thickness direction. The through holes 12 having the uniform cross-sectional shape encompass those with nonuniformity in cross-sectional shape inevitable in the process of forming the through holes 12.

The shape of the opening of each through hole 12 is, for example, circular, oval, or rectangular, preferably circular or oval, and more preferably circular. It is to be noted, however, that the shape of the opening of each through hole 12 is not limited to the above examples.

The opening area of each through hole 12 is, for example, 10 $mm^2$ or less, and may be 7 $mm^2$ or less or even 5 $mm^2$ or less. The lower limit of the opening area of each through hole 12 is, for example, 0.1 $mm^2$ or more, and may be 0.3 $mm^2$ or more or even 0.5 $mm^2$ or more.

The percent open area of the through holes 12 in the double-sided adhesive sheet 11 (the proportion of the total opening area of the through holes 12 on a surface of the double-sided adhesive sheet 11 in the area of the surface of the sheet 11) may be, for example, 60.0% or less, and may be 55.0% or less, 50.0% or less, or even 45.0% or less. The lower limit of the percent open area of the through holes 12 is, for example, 10.0% or more, and may be 15.0% or more, 20.0% or more, 25.0% or more, or even 30.0% or more. In the case where the percent open area of the through holes 12 falls within these ranges, air permeation through the suction fixing sheet 1 in the in-plane direction can be suppressed more reliably while air permeation through the sheet 1 in the thickness direction is ensured. It is preferable that the percent open area of the through holes 12 in the double-sided adhesive sheet 11 falls within these ranges at least in a region to be in contact with a suction target during suction holding of the suction target.

Figure 4:
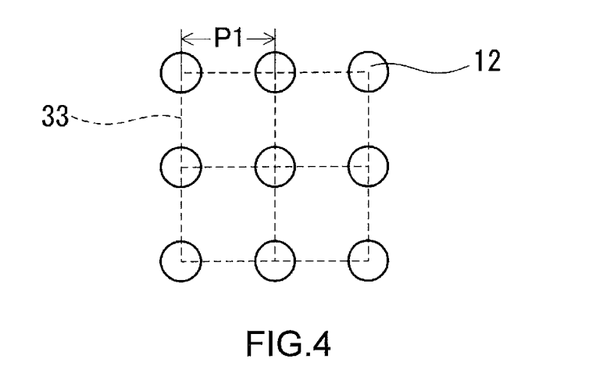
FIG. 4 is a plan view schematically showing an example of the arrangement of through holes in a double-sided adhesive sheet that may be included as an adhesive layer in the suction fixing sheet of the present invention.
Figure 5:
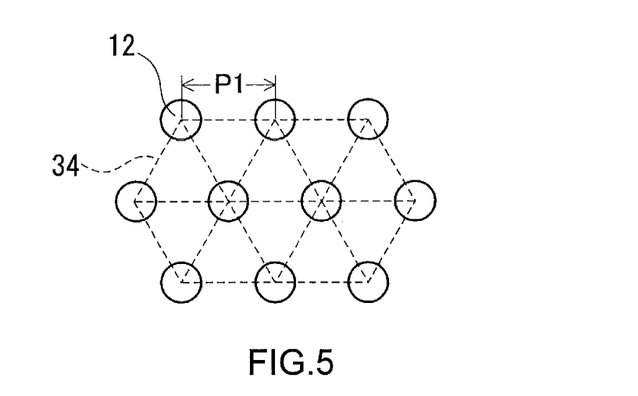
FIG. 5 is a plan view schematically showing another example of the arrangement of the through holes in a double-sided adhesive sheet that may be included as an adhesive layer in the suction fixing sheet of the present invention.

Examples of the arrangement of the through holes 12 in the double-sided adhesive sheet 11 are shown in FIGS. 4 and 5. FIGS. 4 and 5 show the openings of the through holes 12 on a surface of the double-sided adhesive sheet 11. It is to be noted, however, that the arrangement of the through holes 12 on the double-sided adhesive sheet 11 is not limited to the examples shown in FIGS. 4 and 5.

In the example shown in FIG. 4, the through holes 12 are arranged such that, when viewed in a direction perpendicular to the surface of the double-sided adhesive sheet 11, the centers of the openings of the through holes 12 are at intersections (lattice points) of a virtual square lattice 33 on the surface. In the example shown in FIG. 5, the through holes 12 are arranged such that, when viewed in a direction perpendicular to the surface of the double-sided adhesive sheet 11, the centers of the openings of the through holes 12 are at intersections of a virtual equilateral triangular lattice 34 on the surface. The double-sided adhesive sheet 11 may have these arrangements of the through holes at least in a region to be in contact with a suction target during suction holding of the suction target. According to the arrangements of the through holes 12 shown in these examples, it is possible to obtain the suction fixing sheet 1 having more uniform air permeability in the thickness direction over the entire sheet or at least over the entire above-described region. When air permeation through the suction fixing sheet 1 in the thickness direction is more uniform, a suction target can be suction-held more evenly, and a decrease in processing accuracy of the suction target can be suppressed more reliably. In the examples shown in FIGS. 4 and 5, the openings and cross sections of the through holes 12 are all in the same shape, and more specifically, they are in a circular shape. It is to be noted, however, that the openings and/or cross sections of the through holes 12 need not be all in the same shape. Additionally, when the through holes 12 are arranged such that the centers of the openings of the through holes 12 are at intersections of a virtual lattice on the above-specified surface, the lattice is not limited to a square lattice and an equilateral triangular lattice, and may be any of various lattices such as a rectangular lattice and a rhombic lattice. Further, in the examples shown in FIGS. 4 and 5, the centers of the through holes 12 need not be exactly at the intersections of the square lattice 33 or the equilateral triangular lattice 34. For example, displacement of the center positions inevitable in the process of providing the through holes 12 is allowed.

In the examples shown in FIGS. 4 and 5, the center-to-center distance (pitch) P1 of the through holes 12 in closest proximity to each other is, for example, 0.5 mm to 10.0 mm, and may be 1.0 mm to 5.0 mm.

The suction fixing sheet 1 including the double-sided adhesive sheet 11 as the adhesive layer 3 can be formed by, for example, disposing the double-sided adhesive sheet 11 on one surface of the porous sheet 2 with the adhesive agent layer 14a or 14b interposed therebetween. When the adhesive agent layers 14a and 14b have different configurations, the double-sided adhesive sheet 11 may be adhered to the porous sheet 2 with the adhesive agent layer having a larger adhesive strength interposed therebetween. In this case, the suction fixing sheet 1 is fixed to a suction surface of a suction device with the adhesive agent layer having a smaller adhesive strength interposed therebetween. This allows the suction fixing sheet 1 to be replaced more easily. It is to be noted, however, that the method for forming the suction fixing sheet 1 is not limited to the above example.

The double-sided adhesive sheet 11 can be formed by, for example, processing the laminate of the adhesive agent layer 14a, the substrate 13, and the adhesive agent layer 14b to provide a plurality of through holes 12. It is to be noted, however, that the method for forming the double-sided adhesive sheet 11 is not limited to this example. The processing for providing the plurality of through holes 12 can be performed using various perforation methods such as punching, die-cutting with a Thomson blade, and laser irradiation. The laminate of the adhesive agent layers 14a and 14b and the substrate 13 can be formed by, for example, applying an adhesive composition(s) to a surface(s) of the substrate 13 and then drying and/or curing the coating formed by applying the composition(s).

Figure 6A:
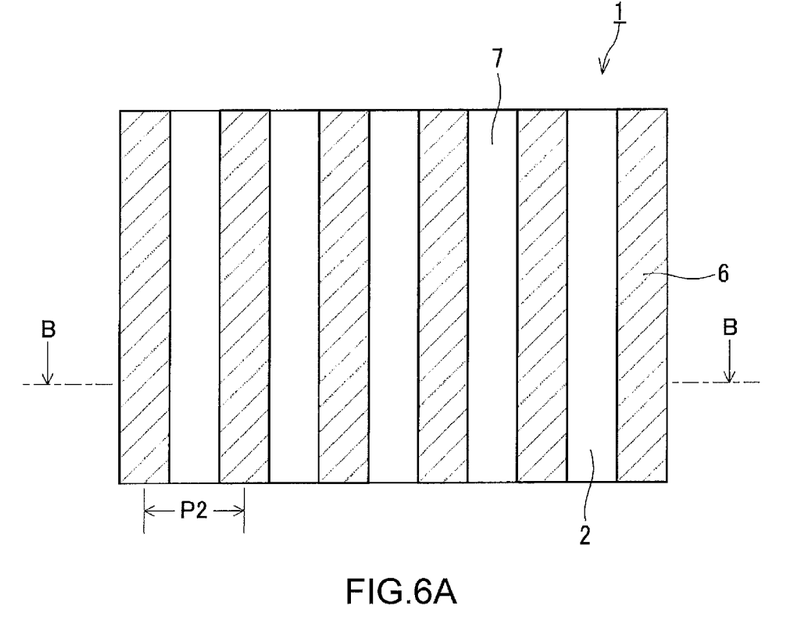
FIG. 6A is a plan view schematically showing another example of the suction fixing sheet of the present invention.
Figure 6B:
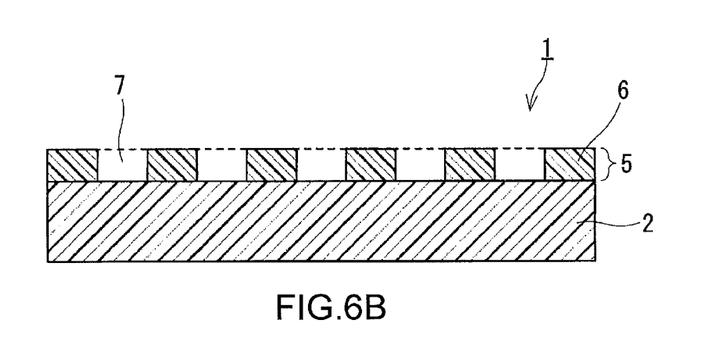
FIG. 6B is a schematic view showing a cross section of the suction fixing sheet in FIG. 6A taken along line B-B.

FIGS. 6A and 6B show an example of a suction fixing sheet including the layer of (2) as the adhesive layer 3. FIG. 6B shows a cross section of the suction fixing sheet 1 in FIG. 6A taken along line B-B. The suction fixing sheet 1 shown in FIGS. 6A and 6B includes a porous sheet 2 having air permeability in its thickness direction and a layer 5 which is the adhesive layer 3 having air permeability in its thickness direction. The layer 5 is formed of a plurality of pieces of an adhesive agent 6. The pieces of the adhesive agent 6 are disposed spaced apart from each other on the one surface of the porous sheet 2. The adhesive agent 6 is a crosslinked adhesive agent. The layer 5 is disposed on one surface of the porous sheet 2. The layer 5 is a double-sided adhesive layer unprovided with a substrate. A space 7 between adjacent pieces of the adhesive agent 6 functions as an air flow path in the thickness direction in the layer 5. The layer 5 has air permeability in the thickness direction owing to the space 7.

In the example shown in FIGS. 6A and 6B, on the one surface of the porous sheet 2, the plurality of pieces of the adhesive agent 6 are disposed spaced apart from each other, thereby forming the layer 5. More specifically, when viewed in a direction perpendicular to the one surface of the porous sheet 2, the pieces of the adhesive agent 6 are arranged in stripes on the one surface.

Figure 7A:
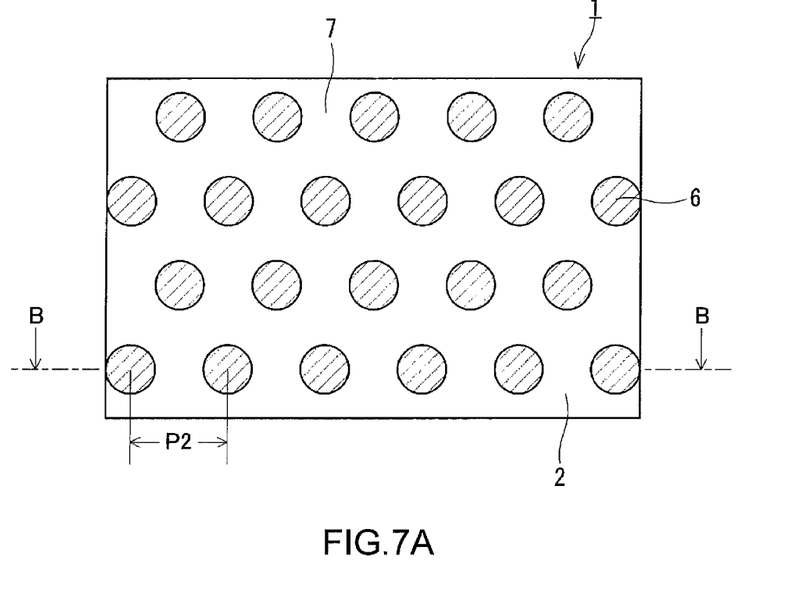
FIG. 7A is a plan view schematically showing yet another example of the suction fixing sheet of the present invention.
Figure 7B:
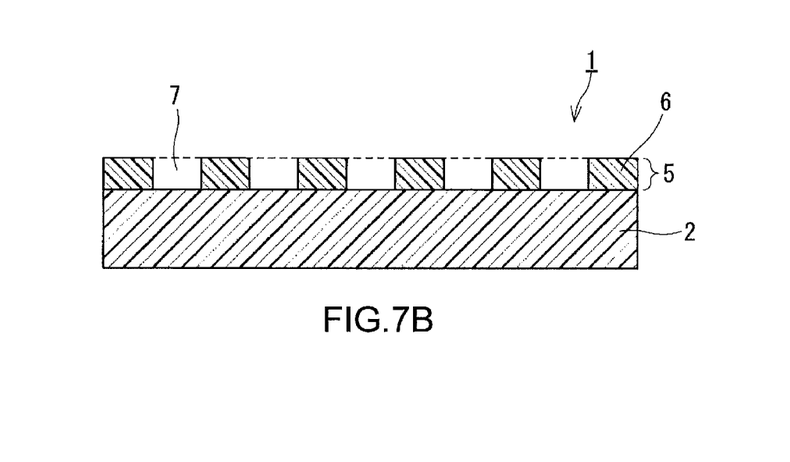
FIG. 7B is a schematic view showing a cross-section of the suction fixing sheet in FIG. 7A taken along line B-B.

FIGS. 7A and 7B show another example of the suction fixing sheet including the layer of (2) as the adhesive layer 3. FIG. 7B shows a cross section of the suction fixing sheet 1 in FIG. 7A taken along line B-B. The suction fixing sheet 1 in FIGS. 7A and 7B is configured the same as the suction fixing sheet 1 in FIGS. 6A and 6B, except that the shapes and the arrangement pattern of the pieces of the adhesive agent 6 in the layer 5 are different. In the example shown in FIGS. 7A and 7B, when viewed in the direction perpendicular to the one surface of the porous sheet 2, the pieces of the adhesive agent 6 having circular shapes are arranged in dots on the one surface. The adhesive agent 6 is arranged such that the centers of the pieces of the adhesive agent 6 are at intersections of a virtual equilateral triangular lattice on the one principal surface. When viewed in the above perpendicular direction, the shapes of the pieces of the adhesive agent 6 arranged in dots are not limited to circles, and may be, for example, polygonal shapes including squares and rectangles or ellipses. When the adhesive agent 6 is arranged such that the centers of the pieces of the adhesive agent 6 are at intersections of a virtual lattice on the one principal surface, the lattice is not limited to an equilateral triangular lattice, and may be any of various lattices such as a square lattice, a rectangular lattice, and a rhombic lattice.

The arrangement (arrangement pattern) of the pieces of the adhesive agent 6 in the layer 5 is not limited to the examples shown in FIGS. 6A, 6B, 7A, and 7B, as long as the layer 5 has the space 7 that allows air permeation in the thickness direction of the layer 5.

The pieces of the adhesive agent 6 are preferably disposed on the one surface of the porous sheet 2 at least in a region to be in contact with a suction target during suction holding of the suction target, and more preferably disposed on the one surface of the porous sheet 2 over the entire above-described region.

The crosslinked adhesive agents given above as examples in the description regarding the double-sided adhesive sheet 11 can be used as the adhesive agent 6.

The thickness of each piece of the adhesive agent 6 is, for example, 1 to 300 μm. The upper limit of the thickness may be 500 μm or less, 100 μm or less, 50 μm or less, or even 10 μm or less. When the thickness of each piece of the adhesive agent 6 falls within these ranges, the above-described effects can be obtained more reliably.

The area of each piece of the adhesive agent 6 when viewed in the direction perpendicular to the one surface of the porous sheet 2 is, for example, 0.05 mm$^2$ or more, and may be 0.1 mm$^2$ or more or 0.5 mm$^2$ or more. It is to be noted, however, that, when the pieces of the adhesive agent 6 are arranged in stripes as shown in FIGS. 6A and 6B, the area of each piece is determined by the width×the length thereof and may exceed the above-described ranges. For example, each of the pieces of the adhesive agent 6 arranged in dots may have an area in the above-described ranges.

The width of each of the pieces of the adhesive agent 6 arranged in stripes as shown in FIGS. 6A and 6B is, for example, 0.1 to 5 mm, and may be 0.5 to 2 mm.

The percentage of occupation of the adhesive agent 6 on the one surface of the porous sheet 2 (when viewed in a direction perpendicular to the one surface of the porous sheet 2, the proportion of the total area of the adhesive agent 6 disposed on the one surface in the area of the one surface) is, for example, 30% or more, and may be 40% or more, 45% or more, 50% or more, 55% or more, 60% or more, or even 65% or more. In the case where the percentage of occupation falls within these ranges, in the layer 5 and the suction fixing sheet 1 including the layer 5, air permeation in the in-plane direction can be suppressed more reliably while air permeation in the thickness direction is ensured, and that can increase the sucked force of the suction fixing sheet 1. Preferably, the percentage of occupation falls within these ranges at least in a region to be in contact with a suction target during suction holding of the suction target.

When viewed in the direction perpendicular to the one surface of the porous sheet 2, the pieces of the adhesive agent 6 may be disposed on the one surface at regular intervals. In this case, the arrangement interval of the pieces of the adhesive agent 6 is, for example, 0.5 to 10 mm, and may be 1 to 5 mm. The pieces of the adhesive agent 6 are arranged in this manner in the examples shown in FIGS. 6A, 6B, 7A, and 7B. The arrangement interval of the pieces of the adhesive agent 6 is usually the center-to-center distance between the pieces of the adhesive agent 6 in closest proximity to each other. In the case where the pieces of the adhesive agent 6 are arranged in stripes as shown in FIGS. 6A and 6B, the arrangement interval is the centerline-to-centerline distance (pitch) P2 between adjacent pieces of the adhesive agent 6. The pieces of the adhesive agent 6 may be disposed at regular intervals on the one surface at least in a region to be in contact with a suction target during suction holding of the suction target by a suction device.

When viewed in the direction perpendicular to the one surface of the porous sheet 2, the pieces of the adhesive agent 6 may have the same shape and/or the same area. The pieces of the adhesive agent 6 may have the same shape and the same area in each of the examples shown in FIGS. 6A, 6B, 7A, and 7B. Further, at least in a region to be in contact with a suction target during suction holding of the suction target by a suction device, the pieces of the adhesive agent 6 may have the same shape and/or the same area when viewed in the direction perpendicular to the one surface of the porous sheet 2.

When viewed in the direction perpendicular to the one surface of the porous sheet 2, each piece of the adhesive agent 6 may be shaped to surround the space 7. Further, when viewed in the direction perpendicular to the one surface of the porous sheet 2, the pieces of the adhesive agent 6 may be arranged on the one surface in such a manner that in all directions from the center toward the perimeter of the suction fixing sheet 1, at least one piece and preferably two or more pieces of the adhesive agent 6 are located between the center and the perimeter. In these cases, in the layer 5 and the suction fixing sheet 1 including the layer 5, air permeation in the in-plane direction can be suppressed more reliably while air permeation in the thickness direction is ensured, and that can increase the sucked force of the suction fixing sheet 1.

The suction fixing sheet 1 including the layer of (2) as the adhesive layer 3 can be formed by, for example, disposing pieces of the adhesive agent 6 in a predetermined pattern on one surface of the porous sheet 2. The suction fixing sheet 1 may be formed by disposing pieces of the adhesive agent 6 in a predetermined pattern on a surface of a transfer sheet and then transferring the thus-arranged pieces of the adhesive agent 6 to one surface of the porous sheet 2. The pieces of the adhesive agent 6 can be disposed in a predetermined arrangement pattern using, for example, a known applicator that can dispose the pieces of the adhesive agent 6 according to the pattern, such as a slot die provided with a shim plate, a dispenser (metered-dose liquid ejection device), or any of various printers. By using a slot die provided with a comb-type shim plate, the pieces of the adhesive agent 6 can be disposed in stripes on one surface of the porous sheet 2. By using a dispenser, a gravure printer, or a rotary screen printer, the pieces of the adhesive agent 6 can be disposed in dots on one surface of the porous sheet 2. It is to be noted, however, that the method for forming the suction fixing sheet 1 is not limited to the above examples.

The thickness of the suction fixing sheet 1 is, for example, 0.065 mm to 6 mm, and may be 0.1 mm to 3.5 mm or 0.25 mm to 1.0 mm.

The air permeability of the suction fixing sheet 1 in the thickness direction as expressed in terms of Frazier number is, for example, 0.1 cm$^3$/(cm$^2$·sec) or more, and may be 0.3 cm$^3$/(cm$^2$·sec) or more, 0.5 cm$^3$/(cm$^2$·sec) or more, 0.7 cm$^3$/(cm$^2$·sec) or more, 0.9 cm$^3$/(cm$^2$·sec) or more, 1.2 cm$^3$/(cm$^2$·sec) or more, or even 1.5 cm$^3$/(cm$^2$·sec) or more. The upper limit of the air permeability as expressed in terms of Frazier number is, for example, 10.0 cm$^3$/(cm$^2$·sec) or less.

The suction fixing sheet 1 has a surface resistivity of, for example, $1.0 \times 10^{12}$ Ω/☐ or less on a surface on the porous sheet 2 side. The above surface resistivity may be $1 \times 10^{11}$ Ω/□ or less, 1×10$^{10}$ Ω/□ or less, or even 1×10$^9$ Ω/□ or less. The lower limit of the above surface resistivity is, for example, but not limited to, 1×10$^7$ Ω/□ or more. When the above surface resistivity falls within these ranges, generation of static electricity is suppressed during suction holding of a suction target, and that can prevent damage, such as a pinhole, to the suction target. The surface resistivity can be evaluated using a resistivity meter (e.g., Hiresta manufactured by Mitsubishi Chemical Analytech Co., Ltd.) capable of measuring the surface resistivity of a high-resistance material.

The suction fixing sheet 1 having a surface resistivity in the above ranges on the surface on the porous sheet 2 side can be formed, for example, by subjecting the porous sheet 2 to antistatic treatment. As the antistatic treatment can be employed, for example, a method of applying an antistatic agent to the porous sheet 2. The antistatic agent can be applied, for example, by applying a treatment liquid containing the antistatic agent to the porous sheet 2 and then drying the applied treatment liquid. The medium of the treatment liquid is a medium which does not deteriorate the porous sheet 2 and which volatilizes at a drying temperature lower than the melting point of the material of the porous sheet 2, and is, for example, an alcohol such as ethanol, water, or an organic solvent. The treatment liquid may further contain any material other than the antistatic agent, for example, an additive such as an ultraviolet absorber or a mold release agent. The treatment liquid can be applied by a known method such as casting, dipping, roll coating, gravure coating, screen printing, reverse coating, spray coating, kiss coating, die coating, metering bar coating, chamber doctor-using coating, curtain coating, or bar coating. The drying temperature is, for example, 50 to 130° C. and preferably 60 to 110° C.

Examples of the antistatic agent include various surfactants such as cationic surfactants, anionic surfactants, amphoteric surfactants, and non-ionic surfactants. Cationic surfactants, anionic surfactants, and non-ionic surfactants are preferred. A combination of two or more antistatic agents may be used as the antistatic agent, but a combination of a cationic surfactant and an anionic surfactant is not recommended. It is to be noted, however, that the antistatic agent is not limited to the surfactants.

Examples of the cationic surfactants that can be used as the antistatic agent include alkylammonium acetates, alkyldimethylbenzylammonium salts, alkyltrimethylammonium salts, dialkyldimethylammonium salts, alkylpyridinium salts, oxyalkylene alkylamines, and polyoxyalkylene alkylamines.

Examples of the anionic surfactants that can be used as the antistatic agent include: fatty acid soda soaps such as sodium stearate soap; alkyl sulfate salts such as sodium lauryl sulfate; alpha-sulfo fatty acid ester salts; alkyl ether sulfate salts; sodium alkylbenzene sulfonates; sodium alkyl naphthalene sulfonates; dialkyl sulfosuccinates; alkyl phosphates; and alkyl diphenyl ether disulfonates.

Examples of the amphoteric surfactants that can be used as the antistatic agent include alkylcarboxybetaines.

Examples of the non-ionic surfactants that can be used as the antistatic agent include polyoxyethylene alkyl ether, sorbitan fatty acid ester, polyoxyethylene sorbitan fatty acid ester, glycerin fatty acid ester, and polyoxyethylene alkylamine.

Commercially-available products may be used as the antistatic agent. Examples of commercially-available antistatic agents include:

- non-ionic surfactants of the polyoxyethylene-polyoxypropylene block copolymer type such as ADEKA (registered trademark) NOL L, P, and F series and ADEKA (registered trademark) NOL TR series;
- non-ionic surfactants of the alkyl ether type such as ADEKA TOL LB series, ADEKA TOL LA series, and ADEKA TOL TN series;
- non-ionic surfactants of the ester type such as ADEKA NOL NK (glyceride ethylene oxide adduct);
- non-ionic surfactants of the special phenol type such as ADEKA TOL PC;
- anionic surfactants of the sulfate salt type such as ADEKA HOPE series;
- anionic surfactants of the phosphoric acid ester or succinic acid ester type such as ADEKA COL series;
- cationic surfactants of the quaternary cation type such as ADEKA MINE series (the above surfactants are manufactured by ADEKA CORPORATION);
- cationic surfactants such as ELECNON series (manufactured by Dainichiseika Color & Chemicals Mfg. Co., Ltd.);
- amphoteric surfactants such as ELEC AC (manufactured by Kao Corporation); and
- non-ionic surfactants such as EMULGEN series, RHEODOL series, EXCEL series, and AMIET series (manufactured by Kao Corporation).

The shape of the suction fixing sheet 1 is, for example, a polygonal shape including a square shape and a rectangular shape or a strip shape. It is to be noted, however, that the shape of the suction fixing sheet 1 is not limited to the above examples. The suction fixing sheet 1 can suppress a decrease in processing accuracy of a suction target even when having a large area.

The area of the suction fixing sheet 1 may be, for example, 50 cm$^2$ or more, 100 cm$^2$ or more, 225 cm$^2$ or more, 400 cm$^2$ or more, 1,000 cm$^2$ or more, or even 10,000 cm$^2$ or more.

The suction fixing sheet 1 may further include a member other than the porous sheet 2 and the adhesive layer 3 as long as the effects of the present invention can be obtained. The member is, for example, a separator disposed on the adhesive layer 3 serving as an exposed surface. The separator is disposed on the suction fixing sheet 1 when the sheet 1 is distributed to the market, and the separator is peeled off from the laminate of the porous sheet 2 and the adhesive layer 3 when the sheet 1 is used (when the sheet 1 is fixed to a suction surface of a suction device). The suction fixing sheet 1 may be composed of the porous sheet 2 and the adhesive layer 3 at least in a region to be in contact with a suction target during suction holding of the suction target.

The suction target may be, for example, a self-supporting sheet such as a metal sheet or a glass sheet, or a non-self-supporting thin sheet-like body such as a metal foil, a plastic film, or a ceramic green sheet. It is to be noted, however, that the suction target is not limited to the above examples. Non-self-supporting thin sheet-like bodies are more likely to have a decreased processing accuracy. However, also when such sheet-like bodies are suction-held, the use of the suction fixing sheet 1 can suppress a decrease in processing accuracy of the sheet-like bodies.

[Suction Holding of Suction Target Using Suction Fixing Sheet]

Figure 8:
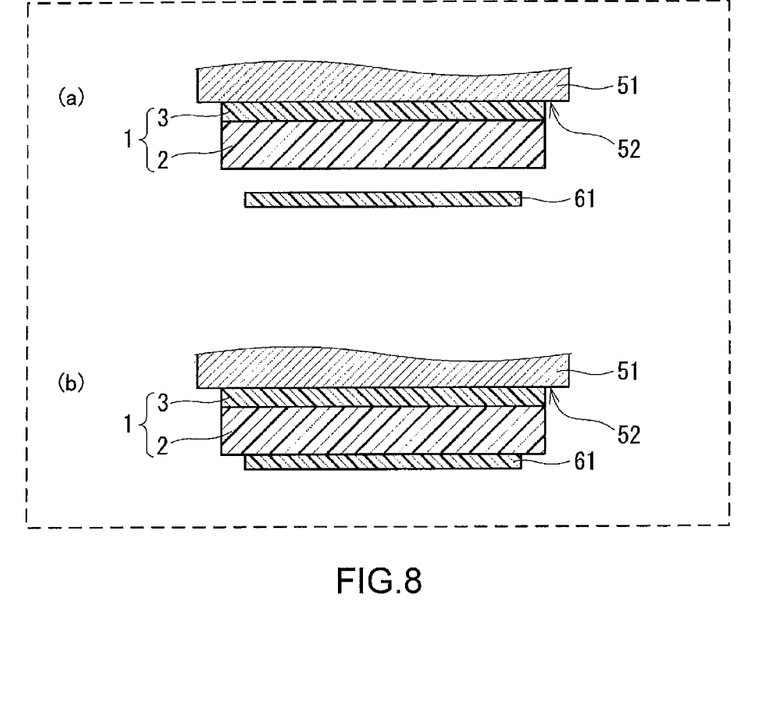
FIG. 8 is a cross-sectional view schematically illustrating steps of suction-holding a suction target onto a suction surface of a suction device with the use of the suction fixing sheet of the present invention.

FIG. 8 illustrates steps of suction-holding a suction target using a suction device with the suction fixing sheet 1 being fixed to a suction surface thereof. As shown in (a), the suction fixing sheet 1 is fixed to a suction surface 52 of a suction unit 51 of the suction device using the adhesive layer 3. Then, as shown in (b), by generating suction force in the suction unit 51, a suction target 61 is suction-held with the suction fixing sheet 1 interposed therebetween.

As the suction device and the suction unit 51, any known device and unit can be used, respectively. The suction surface 52 of the suction unit 51 is commonly a metal surface.

A suction target can be subjected to any processing in a state of being fixed to a suction surface. The processing may be press processing, for example. In press processing, a suction pressing process can be performed in which a suction target is subjected to pressing in a state of being fixed to a suction surface.

EXAMPLES

Hereinafter, the present invention will be described in more detail with reference to examples. The present invention is not limited to the following examples.

First, methods for evaluating suction fixing sheets produced in the examples will be described.

[Ultimate Vacuum Pressure, Air Permeability in the In-Plane Direction, Sucked Force]

The ultimate vacuum pressure, the sucked force, and the air permeability in the in-plane direction were evaluated for the produced suction fixing sheets by the above-described methods. It is to be noted that the dimensions of each suction fixing sheet evaluated were 100 mm×100 mm, and a measurement sheet stacked on each suction fixing sheet was a PET sheet (thickness: 25 μm; dimensions: 100 mm×100 mm). The measurement was carried out 10 minutes after a roller was moved back and forth once over the suction fixing sheets in order to more reliably fix the suction fixing sheets to a suction fixing stage and thereby increase the measurement accuracy. A vane pump (KRF40 manufactured by ORION Machinery Co., LTD.; ultimate pressure (absolute pressure): 86 Pa; effective exhaust velocity: 575 L/min) was used as a vacuum pump. The temperature was 25±10° C. and the relative humidity was 50%±20% in the measurement environment.

[Air Permeability in the Thickness Direction]

The air permeability (Frazier number) of the produced suction fixing sheets in the thickness direction was measured according to Method A for air permeability measurement (Frazier method) prescribed in JIS L 1096: 2010.

[Surface Resistivity]

The surface resistivity on an exposed surface on the porous sheet side was evaluated for the produced suction fixing sheets by measuring the surface resistivity using a high-resistivity meter (Hiresta MCP-HT450 manufactured by Mitsubishi Chemical Analytech Co., Ltd.) equipped with a URS probe having a double ring electrode when 30 seconds had passed since application of a voltage of 500 V. The surface resistivity evaluation was carried out according to JIS K 6911: 2006 in an atmosphere at 25° C. and a relative humidity of 60%.

Example 1

As the porous sheet 2, a sintered sheet of UHMWPE particles (SUNMAP manufactured by Nitto Denko Corporation; thickness: 0.30 mm; dimensions: 100 mm×100 mm) was prepared. Both sides of the prepared sintered sheet had been subjected to antistatic treatment. The air permeability of the thus-prepared porous sheet in its thickness direction was 6.0 cm$^3$/(cm$^2$·sec) as expressed in terms of Frazier number. Next, the adhesive layer 3 (thickness: 7 μm) that was a double-sided adhesive layer unprovided with a substrate was formed by applying pieces of an acrylic adhesive agent in stripes over one entire surface of the prepared porous sheet 2. A suction fixing sheet of Example 1 was thus obtained. The thus-obtained suction fixing sheet included the adhesive layer 3 formed by arranging the pieces of the adhesive agent 6 in stripes on the one surface of the porous sheet 2 when viewed in a direction perpendicular to the one surface. A slot die provided with a comb-type shim plate was used to apply the acrylic adhesive agent. The pieces of the acrylic adhesive agent forming the stripes each had a width of 1.0 mm and a thickness of 7 μm, and the pitch P2, which is a centerline-to-centerline distance between adjacent pieces of the acrylic adhesive agent, was 2.3 μm. The proportion (percentage of occupation) of the area of the adhesive agent in the area of the one surface of the porous sheet was 43.5%. The double-sided adhesive layer had a gel fraction of 30% according to the evaluation using the above-described method. The thickness of the prepared porous sheet and the thickness of the adhesive agent layer were evaluated either using a micrometer (manufactured by Mitutoyo Corporation) or through analysis of a cross-sectional microscopic image. The acrylic adhesive agent used was prepared in the following manner.

First, 95 parts by weight of 2-ethylhexyl acrylate, 5 parts by weight of acrylic acid, 0.2 parts by weight of benzoyl peroxide (BPO), which is an organic peroxide crosslinking agent, and 100 parts by weight of ethyl acetate were mixed together, and the resultant mixture was subjected to nitrogen gas purge for 2 hours. Subsequently, polymerization of the mixture was allowed to proceed at 60° C. for 6 hours in the nitrogen gas atmosphere. As a result, an acrylic polymer having a weight-average molecular weight of 800,000 was obtained. Next, 0.14 parts by weight of a trifunctional isocyanate compound (trade name: Coronate L, manufactured by Tosoh Corporation) and 0.007 parts by weight of a polyfunctional epoxy resin (trade name: TETRAD-C, manufactured by Mitsubishi Gas Chemical Company, Inc.) were added to 100 parts by weight of the solid content of the obtained acrylic polymer. In this manner, the above-described acrylic adhesive agent was prepared.

Example 2

A suction fixing sheet of Example 2 was obtained in the same manner as in Example 1, except that the adhesive layer 3 that was a double-sided adhesive layer unprovided with a substrate was formed by applying pieces of the acrylic adhesive agent in dots over one entire surface of the prepared porous sheet 2. The thus-obtained suction fixing sheet included the adhesive layer 3 (thickness: 7 μm) formed by arranging the pieces of the adhesive agent 6 in dots on the one surface of the porous sheet 2 when viewed in a direction perpendicular to the one surface. A gravure printer (gravure roll) was used to apply the acrylic adhesive agent. Each of the pieces of the acrylic adhesive agent forming the dots was in a circular shape having dimensions of 0.92 mm in diameter and 7 μm in thickness when viewed in a direction perpendicular to the one surface. The pitch P1, which is the center-to-center distance between the pieces of the acrylic adhesive agent in closest proximity to each other, was 1.06 μm. The proportion (percentage of occupation) of the area of the adhesive agent in the area of the one surface of the porous sheet was 68.1%.

Example 3

As a porous sheet, a sintered sheet of UHMWPE particles, as used in Example 1, was prepared. In addition to this sheet, a sheet (No. 5603 manufactured by Nitto Denko Corporation; thickness: 30 μm; dimensions: 100 mm×100 mm) including a PET substrate (thickness: 12 μm) and acrylic adhesive agent layers (each having a thickness of 9 μm) arranged on both surfaces of the PET substrate was prepared as a double-sided adhesive sheet. The acrylic adhesive agent layers had a gel fraction of 9% according to the evaluation using the above-described method. Next, the prepared double-sided adhesive sheet was subjected to press processing using a die to form a plurality of through holes passing through the sheet in a direction perpendicular to the surfaces thereof. The cross section and the opening of each through hole were in a circular shape. In other words, each of the thus-formed through holes had a columnar shape. The through holes were formed over the entire sheet in such a manner that, as shown in FIG. 5, the through holes were at intersections of a virtual equilateral triangular lattice when viewed in a direction perpendicular to the surfaces of the sheet. The diameter (opening diameter) of each of the thus-formed through holes was set to 2.0 mm, and the center-to-center distance (pitch) P1 of the through holes in closest proximity to each other was set to 3.0 mm. The percent open area of the double-sided adhesive sheet was 40.3%. The thicknesses of the substrate and the adhesive agent layer of the prepared double-sided adhesive sheet and the thickness of the double-sided adhesive sheet were evaluated through analysis of a cross-sectional microscopic image.

Next, the prepared porous sheet and double-sided adhesive sheet were bonded together in such a manner that one of the adhesive agent layers of the double-sided adhesive sheet was in contact with the porous sheet and the outer peripheries of the sheets were aligned with each other. Thus, a suction fixing sheet of Example 3 was obtained.

Comparative Example 1

A suction-fixing sheet including, as an adhesive layer, a double-sided adhesive layer unprovided with a substrate and formed by arranging pieces of the adhesive agent in stripes on one surface of a porous sheet when viewed in a direction perpendicular to the one surface of the porous sheet was obtained in the same manner as in Example 1, except that, by changing the shim plate, the width and the thickness of each of the pieces of the acrylic adhesive agent forming the stripes were set to 1.1 mm and 21 μm, respectively, and the pitch P2 was set to 2.7 μm. The proportion (percentage of occupation) of the area of the adhesive agent in the area of the one surface of the porous sheet was 41.5%.

Comparative Example 2

A suction-fixing sheet including a double-sided adhesive layer unprovided with a substrate and formed by arranging pieces of the adhesive agent in stripes on one surface of a porous sheet when viewed in a direction perpendicular to the one surface of the porous sheet was obtained in the same manner as in Example 1, except that, by changing the shim plate, the width and the thickness of each of the pieces of the acrylic adhesive agent forming the stripes were set to 1.9 mm and 31 μm, respectively, and the pitch P2 was set to 3.1 μm. The proportion (percentage of occupation) of the area of the adhesive agent in the area of the one surface of the porous sheet was 61.5%.

Table 1 below shows the results of the evaluation of the above properties of the suction fixing sheets of Examples 1 to 3 and Comparative Examples 1 and 2. Table 1 also shows the above properties of the porous sheet alone used in Examples and Comparative Examples and the ratio (sucked force ratio) of the sucked force of Examples and Comparative Examples to the sucked force, defined as "1", of the porous sheet alone. The ultimate vacuum pressure, the air permeability in the in-plane direction, and the sucked force were measured for the porous sheet alone by the above-described methods, except that the sheet was not fixed by means of an adhesive layer and was just placed on the suction fixing stage 21.

TABLE 1

| | Sucked force (N) | Sucked force ratio | Ultimate vacuum pressure (kPa) | Air permeability in in-plane direction (L/min) | Air permeability in thickness direction (cm$^3$/(cm$^2$ · sec)) | Surface resistivity (×10$^{-9}$/□) |
|---|---|---|---|---|---|---|
| Example 1 | 525 | 1.02 | 52.5 | 11.8 | 3.5 | 5.0 |
| Example 2 | 590 | 1.15 | 59.0 | 9.0 | 1.9 | 5.0 |
| Example 3 | 501 | 0.97 | 50.1 | 11.4 | 2.4 | 5.0 |
| Comparative Example 1 | 443 | 0.86 | 44.3 | 14.5 | 2.3 | 5.0 |
| Comparative Example 2 | 438 | 0.85 | 43.8 | 14.6 | 1.7 | 5.0 |
| Reference Example (porous sheet alone) | 515 | 1 | 51.5 | 11.3 | 6.0 | 5.0 |

INDUSTRIAL APPLICABILITY

The suction fixing sheet of the present invention is applicable to the same uses as conventional suction fixing sheets.

The invention claimed is:

1. A suction fixing sheet to be placed on a suction surface of a suction device to prevent contact between a suction target and the suction surface, the suction fixing sheet comprising:
a porous sheet having air permeability in its thickness direction; and
an adhesive layer having air permeability in its thickness direction and disposed on one surface of the porous sheet, the adhesive layer having a plurality of through holes that provide the air permeability, and wherein a center-to-center distance of through holes that are in closest proximity to each other is in a range of 1.0 mm to 5.0 mm; wherein the adhesive layer serves as an exposed surface when the suction fixing sheet is used, the adhesive layer comprises a crosslinked adhesive agent, and sucked force obtained for the suction fixing sheet when the sheet area is 100 cm$^2$ is 450 N or more, the sucked force being a value determined as per the following equation: ultimate vacuum pressure (kPa)×sheet area 100 cm$^2$, the ultimate vacuum pressure (kPa) being caused to occur in a predetermined suction fixing stage when suction force is generated in the suction fixing stage in the state where the suction fixing sheet is fixed to the suction fixing stage with the adhesive layer interposed therebetween and a non-air permeable measurement sheet is stacked on a surface on the porous sheet side of the suction fixing sheet, wherein an air permeability of the suction fixing sheet in an in-plane direction is 9.0 to 11.8 (L/min).

2. The suction fixing sheet according to claim 1, wherein the thickness of the adhesive layer is 1 to 300 μm.

3. The suction fixing sheet according to claim 1, wherein the porous sheet is a sintered sheet of ultrahigh molecular weight polyethylene particles.

4. The suction fixing sheet according to claim 1, wherein the air permeability of the suction fixing sheet in the thickness direction is 0.1 cm$^3$/(cm$^2$·sec) or more as expressed in terms of Frazier number measured according to Method A for air permeability measurement (Frazier method) prescribed in JIS L 1096: 2010.

5. The suction fixing sheet according to claim 1 having a surface resistivity of $1.0 \times 10^{12}$ Ω/☐ or less on a surface on the porous sheet side.

6. The suction fixing sheet according to claim 1, wherein the adhesive layer is a double-sided adhesive sheet having a substrate and provided with the plurality of through holes.

7. The suction fixing sheet according to claim 6, wherein, in a region of the suction fixing sheet to be in contact with the suction target during suction holding of the suction target by the suction device, a percent open area of the through holes in the double-sided adhesive sheet is 60% or less.

8. A suction fixing sheet to be placed on a suction surface of a suction device to prevent contact between a suction target and the suction surface, the suction fixing sheet comprising:

a porous sheet having air permeability in its thickness direction; and an adhesive layer having air permeability in its thickness direction and disposed on one surface of the porous sheet, the adhesive layer being a single layer; wherein the adhesive layer serves as an exposed surface when the suction fixing sheet is used, the adhesive layer is in contact with the porous sheet, the adhesive layer comprises a crosslinked adhesive agent, and sucked force obtained for the suction fixing sheet when the sheet area is 100 cm$^2$ is 450 N or more, the sucked force being a value determined as per the following equation: ultimate vacuum pressure (kPa)×sheet area 100 cm$^2$, the ultimate vacuum pressure (kPa) being caused to occur in a predetermined suction fixing stage when suction force is generated in the suction fixing stage in the state where the suction fixing sheet is fixed to the suction fixing stage with the adhesive layer interposed therebetween and a non-air permeable measurement sheet is stacked on a surface on the porous sheet side of the suction fixing sheet, wherein an air permeability of the suction fixing sheet in an in-plane direction is 9.0 to 11.8 (L/min).

9. The suction fixing sheet according to claim 8, wherein the thickness of the adhesive layer is 1 to 300 μm.

10. The suction fixing sheet according to claim 8, wherein the porous sheet is a sintered sheet of ultrahigh molecular weight polyethylene particles.

11. The suction fixing sheet according to claim 8, wherein the air permeability of the suction fixing sheet in the thickness direction is 0.1 cm$^3$/(cm$^2$·sec) or more as expressed in terms of Frazier number measured according to Method A for air permeability measurement (Frazier method) prescribed in JIS L 1096: 2010.

12. The suction fixing sheet according to claim 8 having a surface resistivity of $1.0 \times 10^{12}$ Ω/☐ or less on a surface on the porous sheet side.

13. The suction fixing sheet according to claim 8, wherein the adhesive layer is a layer formed of a plurality of pieces of the adhesive agent disposed spaced apart from each other on the one surface of the porous sheet.

14. The suction fixing sheet according to claim 13, wherein, in a region of the suction fixing sheet to be in contact with the suction target during suction holding of the suction target by the suction device, the plurality of pieces of the adhesive agent have the same shape and the same area when viewed in a direction perpendicular to the one surface of the porous sheet.

15. The suction fixing sheet according to claim 13, wherein, in a region of the suction fixing sheet to be in contact with the suction target during suction holding of the suction target by the suction device, the plurality of pieces of the adhesive agent is disposed at regular intervals.

16. The suction fixing sheet according to claim 13, wherein, in a region of the suction fixing sheet to be in contact with the suction target during suction holding of the suction target by the suction device, when viewed in a direction perpendicular to the one surface of the porous sheet, the proportion of the total area of the adhesive agent in the area of the one surface is 40% or more.

* * * * *